United States Patent
Loeda et al.

(10) Patent No.: US 8,324,969 B2
(45) Date of Patent: Dec. 4, 2012

(54) DELTA-SIGMA MODULATOR APPROACH TO INCREASED AMPLIFIER GAIN RESOLUTION

(75) Inventors: Sebastian Loeda, Edinburgh (GB); Alisdair Muir, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 83 days.

(21) Appl. No.: 13/065,301

(22) Filed: Mar. 18, 2011

(65) Prior Publication Data

US 2012/0229316 A1    Sep. 13, 2012

(30) Foreign Application Priority Data

Mar. 11, 2011  (EP) ..................................... 11368008

(51) Int. Cl.
H03G 3/12    (2006.01)
(52) U.S. Cl. ........ 330/282; 341/143; 330/254; 330/250; 330/283; 330/278; 330/258; 716/119; 716/122; 716/133; 327/564; 327/565
(58) Field of Classification Search .......... 341/143–155; 327/564, 565; 716/119, 122, 133; 330/250–284
See application file for complete search history.

(56) References Cited

U.S. PATENT DOCUMENTS

| | | | |
|---|---|---|---|
| 4,555,668 A | 11/1985 | Gregorian et al. | |
| 4,873,492 A | 10/1989 | Myer | |
| 4,910,797 A | 3/1990 | Min et al. | |
| 5,233,309 A | 8/1993 | Spitalny et al. | |
| 5,486,791 A | 1/1996 | Spitalny et al. | |
| 5,821,890 A * | 10/1998 | Kim et al. | 341/143 |
| 6,424,221 B1 | 7/2002 | Korn | |
| 6,507,301 B2 * | 1/2003 | Locher | 341/143 |
| 6,646,509 B2 * | 11/2003 | Sobel | 330/282 |

(Continued)

FOREIGN PATENT DOCUMENTS
WO    WO 2008/031072    3/2008

OTHER PUBLICATIONS

European Search Report—App. No. 11368008.6-2215 Mail Date—Aug. 31, 2011, Dialog Semiconductor GmbH.

*Primary Examiner* — Lam T Mai
(74) *Attorney, Agent, or Firm* — Saile Ackerman LLC; Stephen B. Ackerman

(57) ABSTRACT

A variable gain amplifier device (100) with improved gain resolution is achieved. The device includes a programmable gain amplifier (PGA) (110), an analog-to-digital converter (ADC) (160), an automatic level control (ALC) algorithm means (176), and a delta-sigma modulator (180). The PGA (110) is capable to receive and to amplify an analog input signal (154) to thereby generate an analog output signal (164). The PGA (110) includes an amplifier (160) and a switchable resistor network (120). The ADC (170) is coupled to the PGA (110) and is capable to convert the analog output signal (164) to a digital signal (174). The ALC algorithm means (176) is coupled to the ADC (170) and is capable to generate a control code (178) by processing the digital signal (174). The delta-sigma modulator (186) is coupled to the ALC algorithm means (186) and is capable to generate a pulse-density modulated (PDM) signal (182) by processing the control code (178). The PDM signal (182) is fed back to the PGA (110) to control the switchable resistor network (120).

25 Claims, 4 Drawing Sheets

U.S. PATENT DOCUMENTS

| | | | |
|---|---|---|---|
| 6,833,759 B2 * | 12/2004 | Sobel | 330/282 |
| 6,888,405 B2 | 5/2005 | Cheung et al. | |
| 6,891,434 B2 * | 5/2005 | Sobel | 330/253 |
| 6,958,648 B2 | 10/2005 | Cheung et al. | |
| 7,026,875 B2 | 4/2006 | Sobel | |
| 7,116,261 B1 * | 10/2006 | Li et al. | 341/155 |
| 7,358,579 B2 * | 4/2008 | Ma et al. | 257/415 |
| 7,414,557 B2 * | 8/2008 | Andersson et al. | 341/143 |
| 7,417,506 B2 | 8/2008 | Klein et al. | |
| 7,515,310 B2 | 4/2009 | Llewellyn et al. | |
| 7,545,209 B2 | 6/2009 | Hughes | |
| 7,545,210 B2 | 6/2009 | Hughes | |
| 7,605,659 B2 | 10/2009 | Hughes | |
| 7,733,174 B2 | 6/2010 | Sharma et al. | |
| 2009/0096528 A1 | 4/2009 | Nakai et al. | |
| 2010/0244952 A1 | 9/2010 | Kamibayashi | |

\* cited by examiner

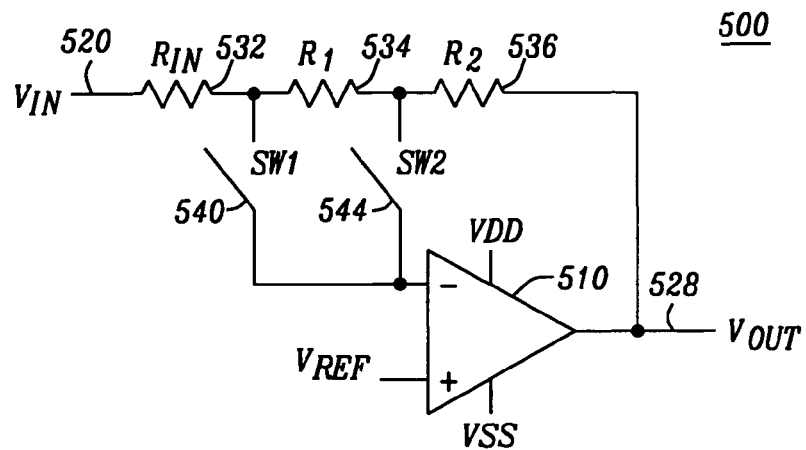
*FIG. 6 - Prior Art*
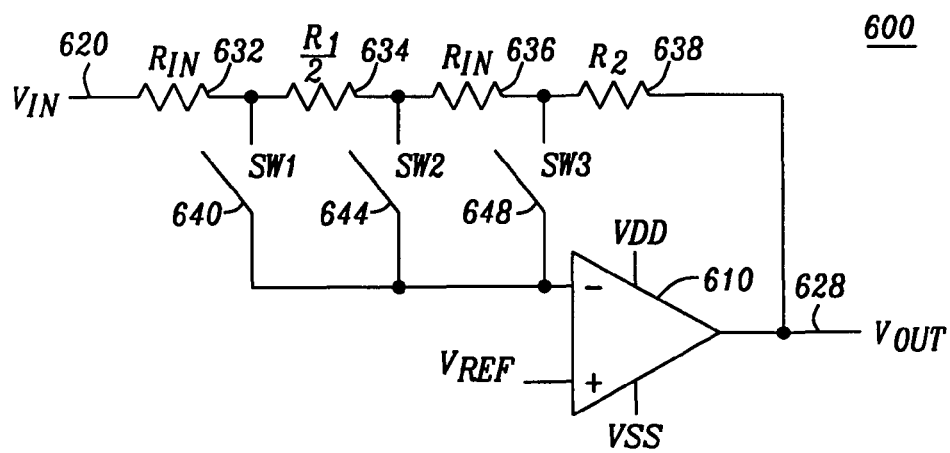
*FIG. 7 - Prior Art*

DELTA-SIGMA MODULATOR APPROACH TO INCREASED AMPLIFIER GAIN RESOLUTION

FIELD OF THE INVENTION

The invention relates generally to variable gain amplifier circuits and methods and, more particularly, to a variable gain amplifier circuit device having improved gain resolution and a method thereof.

BACKGROUND OF THE INVENTION

Digital Signal Processors (DSP) are frequently incorporated into modern integrated circuits due to the flexibility and reliability provided in these processing circuits. DSP circuits are used to implement complex audio functions such as echo cancellation, audio equalization effects, and encoding. In some applications, it is desirable to digitally process an analog signal using the DSP. For example, it may be desirable to capture, process, and reproduce an external audio source, such as a human voice or music. This audio signal must first be captured as an analog signal, typically using a microphone, and then converted to a digital format prior to processing in the DSP circuit. An analog-to-digital converter (ADC) is typically used for the conversion step. This ADC must accurately convert the audio signal, without distortion, to maintain High-Fidelity (Hi-Fi) audio quality throughout the signal path.

In portable electronic devices where external audio is captured and processed, an important issue is the potential for large variation of audio input amplitude as recording conditions change. For example, the distance between the microphone and the audio source may vary over time. Large amplitude variation creates conflicting requirements for the ADC and makes it difficult to maintain high quantization precision over a wide-dynamic range. A common solution to this problem is to subject the analog input signal to a programmable-gain amplifier (PGA) prior to the ADC. A PGA is designed to maintain at its output a fixed amplitude analog voltage invariant of fluctuations in the amplitude of the analog input signal. To achieve this effect, an automatic level control (ALC) algorithm monitors the digital code produced by the ADC and alters the gain of the PGA so as, ideally, to maintain a fixed input amplitude to the ADC. With the ADC signal now at a fixed level above the quantization noise, the conflicting requirements on the ADC are eased.

An example of a prior art programmable-gain amplifier circuit 500 is illustrated in a circuit schematic block diagram in FIG. 6. The circuit 500 includes an operation amplifier 510, a series of resistors 532, 534, and 536, and switches 540 and 544. With either of the switches SW1 540 or SW2 544 closed, a feedback path is created from the amplifier output $V_{OUT}$ 528 to the non-inverting amplifier input. This feedback path creates a gain function from the signal input $V_{IN}$ 520 to the output $V_{OUT}$ 528. For example, if switch SW1 540 is closed while SW2 544 is open, then transfer gain is found to be $V_{OUT}/V_{IN}=-(R_1+R_2)/R_{IN}$. Where $R_{IN}=R_1=R_2$, the resulting gain is −2 or +6 dB. Similarly, if switch SW1 540 is open while SW2 544 is closed, then transfer gain is found to be $V_{OUT}/V_{IN}=-(R_2)/(R_{IN}+R_1)$. Where $R_{IN}=R_1=R_2$, the resulting gain is −½ or −6 dB. Therefore, the gain magnitude of the programmable gain amplifier circuit 500 can be varied from −6 dB to +6 dB by selectively closing or opening the switches. The gain resolution of the circuit 500 is defined as the minimum step to which the gain magnitude may be adjusted. Here, since there are only two states, the minimum step is +6 dB−(−6 dB) or 12 dB. Therefore the gain resolution is 12 dB. Gain resolution is an important parameter for audio quality. Fine gain resolution is desirable to avoid audible ALC gain changes.

Another prior art programmable gain amplifier circuit 600 is shown in FIG. 7. This circuit 600 improves the gain resolution by extending the resistor network to four resistors 632, 634, 636, and 638, and the switching network to three switches 640, 644, and 648. The total value of resistance in the feedback loop has not been altered. So no additional silicon area is required for resistors. However, an additional switch SW3 648 and switch control line are required. The transfer gain remains +6 dB for the case when SW1 540 is closed. Closing switch SW3 648 results in a gain of −6 dB (as was the case for the SW2 switch of the prior circuit). However, if SW2 644 is closed, the transfer gain is −1 or 0 dB. It can be seen that this circuit 600 is able to maintain a gain magnitude range of 12 dB, while generating a finer gain resolution of 6 dB. In general, better gain resolution may be achieved by adding additional resistors, switches, and control signals. However, if the total resistance is to be kept constant, then the unit size of each resistor must be reduced. This unit size reduction impairs resistor matching on the integrated circuit. Conversely, if the proper unit size is maintained, then the additional series resistors will consume significant silicon area. Hence, there is typically a trade-off between silicon area and gain resolution.

Gain resolution may also be improved through the use of a zero-crossing detector. A PGA utilising a zero-cross detector will only allow gain changes when the input audio signal is at minimum amplitude (i.e. zero). Any audible artifacts introduced by the gain variation are minimized due to the signal being at a minimum when the gain is changed. However, zero-cross detectors are undesirable for several reasons, including additional power and area requirements and significant circuit complexity. Furthermore, zero-cross detectors are susceptible to problems caused by offset in the signal path or absence of a signal. While noise gates can be used to alleviate these problems, noise gates limit the effective noise performance of the circuit.

Poor gain-resolution in the analog domain may also be compensated by including additional digital gain stages as in discussed in published U.S. Pat. Application 2005/0195448 to Llewellyn, et al. However, gain changes that occur after digital quantization do not experience the same dynamic range improvement as found in the analog domain due to the fixed signal-to-noise ratio of the digital stages. Further, the addition of the digital gain stages adds complexity to the ALC circuit, which must synchronize the gain changes to avoid audible distortion.

Another alternative for improving gain resolution is to periodically switch between the resistor ratios. Referring again to FIG. 6, switches SW1 540 and SW2 544 may each be controlled by a pulse width modulated (PWM) signal. For example, if each switch were controlled by a PWM signal operating at the same % duty cycle, yet at opposite phases for each switch, then at any moment one switch is OFF while the other switch is ON. As a result, the variable gain would oscillate between +6 dB and −6 dB. If the PWM signals are set to 50%, the average gain of the circuit would be at the midpoint of the two gains, or 0 dB. If the period of the PWM is sufficiently short, then this average value of 0 dB would appear as the transfer gain of the PGA circuit 500 and there would be no audible artifacts. Further, the gain of such a PGA circuit can be varied between the maximum and minimum gains of +6 dB and −6 dB by varying the PWM duty cycle. This PWM approach does not require additional switches or control lines. However, due to the nature of the sliding resistor, the gain does not vary linearly. Rather, the gain varies logarithmically with the duty cycle. However, if fine resolution is desired, then a very high frequency clocking reference must be used. Integrated circuits are restricted in the maximum reference clock available due to power and circuit complexity constraints; thus limiting the gain-resolution practically achievable using only PWM.

SUMMARY OF THE INVENTION

A principal object of the present invention is to provide a variable gain input circuit device.

A further object of the present invention is to provide a variable gain input circuit device with improved gain resolution.

Another further object of the present invention is to provide a method to vary gain in an input circuit device.

In accordance with the objects of this invention, a variable gain amplifier device with improved gain resolution is achieved. The device includes a programmable gain amplifier, an analog-to-digital converter, an automatic level control algorithm means, and a delta-sigma modulator. The programmable gain amplifier is capable to receive an analog input signal and to amplify the analog input signal to thereby generate an analog output signal. The programmable gain amplifier includes an amplifier and a switchable resistor network. The analog-to-digital converter is coupled to the programmable gain amplifier and is capable to convert the analog output signal to a digital signal. The automatic level control algorithm means is coupled to the analog-to-digital converter and is capable to generate a control code by processing the digital signal. The delta-sigma modulator is coupled to the automatic level control means and is capable to generate a pulse-density modulated signal by processing the control code. The pulse-density modulated signal is fed back to the programmable gain amplifier to control the switchable resistor network.

Also in accordance with the objects of this invention, another variable gain circuit device is achieved. The device includes a variable gain amplifier device with improved gain resolution, a digital signal processor, and a digital-to-analog converter. The programmable gain amplifier is capable to receive an analog input signal and to amplify the analog input signal to thereby generate an analog output signal. The programmable gain amplifier includes an amplifier and a switchable resistor network. The analog-to-digital converter is coupled to the programmable gain amplifier and is capable to convert the analog output signal to a digital signal. The automatic level control algorithm means is coupled to the analog-to-digital converter and is capable to generate a control code by processing the digital signal. The delta-sigma modulator is coupled to the automatic level control means and is capable to generate a pulse-density modulated signal by processing the control code. The pulse-density modulated signal is fed back to the programmable gain amplifier to control the switchable resistor network. The digital signal processor is coupled to the analog-to-digital converter and is capable to process the digital signal into a second digital code. The digital-to-analog converter is coupled to the digital signal processor and is capable to covert the second digital code to a second analog output signal.

Also in accordance with the objects of this invention, a method to improve gain resolution in a programmable gain amplifier device is achieved. The method includes receiving an analog input signal at a programmable gain amplifier. The analog input signal is amplified to thereby generate an analog output signal. A gain of the programmable gain amplifier is adjusted by controlling a switchable resistor network. The analog output signal is converted to a digital signal. A control code is generated by processing the digital signal in an automatic level control (ALC) algorithm. A pulse-density modulated signal is generated by processing the control code in a delta-sigma modulator. The pulse-density modulated signal is fed back to the programmable gain amplifier to control the switchable resistor network.

As such, a novel variable gain amplifier device with improved gain resolution and a method to improve gain resolution in a variable gain amplifier device are herein described. The circuit provides variable gain amplification with improved gain resolution. The improved gain resolution is achieved with minimal impact on silicon area or power usage. The improved gain resolution is achieved within normal clock frequency limitations. The device and method are applicable to a variety of programmable gain amplifiers, resistor network schemes, and gain-to-code relationships. The device and method are extensible to add frequency dependent filtering functions. Other advantages will be recognized by those of ordinary skill in the art.

BRIEF DESCRIPTION OF THE DRAWINGS

The present invention and the corresponding advantages and features provided thereby will be best understood and appreciated upon review of the following detailed description of the invention, taken in conjunction with the following drawings, where like numerals represent like elements, in which:

FIG. 6 is a circuit schematic block diagram illustrating a prior art, programmable gain amplifier circuit; and FIG. 7 is a circuit schematic block diagram illustrating a prior art, programmable gain amplifier circuit.

DETAILED DESCRIPTION OF THE INVENTION

Figure 1:
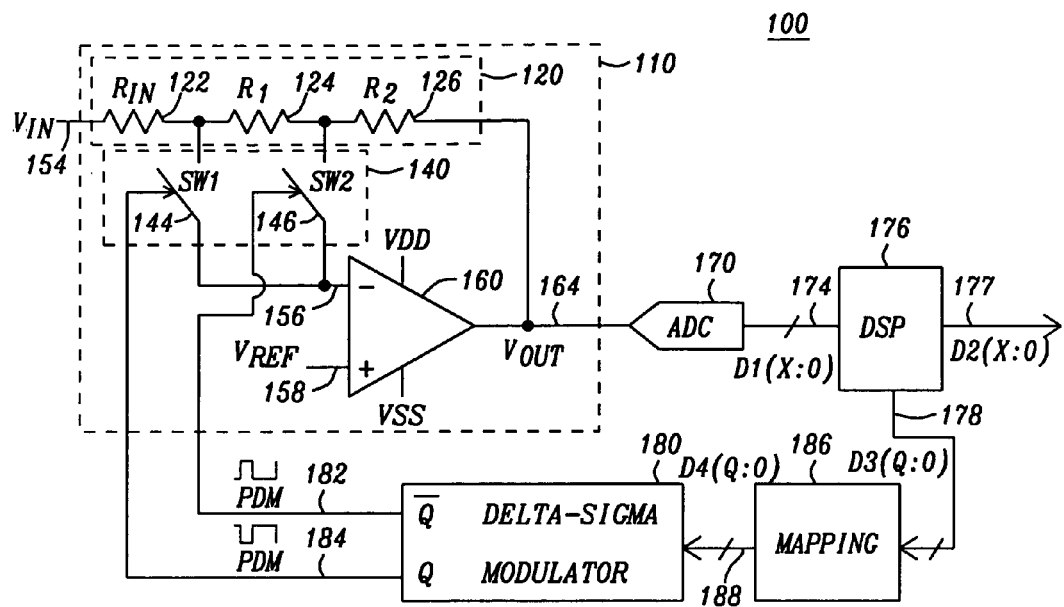
FIG. 1 is a circuit schematic diagram illustrating one example of a variable gain amplifier device in accordance with one embodiment of the invention.

FIG. 1 is a circuit schematic diagram illustrating one example of a variable gain amplifier device 100 in accordance with one embodiment of the invention. The device 100 includes a programmable gain amplifier (PGA) 110, an analog-to-digital converter 170, and a delta-sigma modulator 180. The programmable gain amplifier 110 includes an amplifier 160 having an input 156 and an output 164, and a switchable resistor network 120. The switchable resistor network 120 includes resistors 122, 124, and 126, and switches 144 and 146. The resistor $R_{IN}$ 122, $R_1$ 124, and $R_2$ 126 are arranged in series from the PGA input $V_{IN}$ 154 to the PGA output $V_{OUT}$ 164. The switches SW1 144 and SW2 146 arranged between the amplifier input 156 and nodes between the resistors 122, 124, and 126. The amplifier 160 is preferably an operational amplifier with inverting and non-inverting inputs as is known in the art. While a single-ended amplifier is shown, a differential input/output amplifier may alternatively be used and the switchable resistor network adjusted accordingly. For the illustrated embodiment, the non-inverting input 158 is preferably coupled to a reference voltage $V_{REF}$ 158 to enable a voltage reference point. The inverting input 156 is coupled to one side of the switchable resistor network 120. It should be understood that a wide variety of operational amplifier technologies and designs may be selected and successfully used in the present invention. For example, the amplifier 160 may be implemented in MOS or bipolar technologies or a mixed technology.

One side of each switch SW1 144 and SW2 146 is coupled to the inverting input 156 of the amplifier 160. The other side of each switch 144 and 146 is coupled to a specific node, or tap, within the resistor series. While the embodiment illustrates a switching network with only two switches, it should be understood that multiple switches may be used in the present invention. The switches may be implemented in any available technology, such as MOS or bipolar or mixed technology. The switches are controlled by a pulse-density modulated (PDM) signal 182. A complimentary PDM signal 184 is also provided by the delta-sigma modulator 180. The switch control may be direct, as shown, or indirect. For example, the PDM signal 182 may by connected directly to the gate of a MOS-based transistor switch 146. However, elaborate control couplings may be used as known in the art. The switchable resistor network 120 forms a variable resistance feedback path between the PGA input 154 and the amplifier inverting input 156 and between the amplifier inverting input 156 and the amplifier output 164. The transfer gain from input VIN 154 to output VOUT 164 is established based on the relative values of the effective input resistance at the inverting input 156 and the effective feedback resistance at the output 164. As will be described below, these effective resistances change over time depending on the state of the PDM signals 182 and 184 generated from the delta-sigma modulator 180.

The analog-to-digital converter (ADC) 170 is coupled to the PGA output $V_{OUT}$ 164. The ADC 170 samples the amplifier output $V_{OUT}$ 164 at a sampling frequency to generate a digital signal D1(X:0) 174, which is a series of digital words, each X+1 bits wide, where each word corresponds to a sampled value in time. For example, the ADC 170 may generate the digital signal D1(X:0) 174 as a 4-bit code at a frequency of 64 $f_s$ where $f_s$ is the Nyquist frequency for the frequencies of interest in the input signal $V_{IN}$.

In the preferred embodiment, a digital signal processor (DSP) 176 is included to implement an automatic level control (ALC) algorithm. In particular, the DSP 176 is coupled to the analog-to-digital converter 170. The DSP 176 is capable to process the digital signal D1(X:0), via an ALC algorithm, to generate a control code D3(Z:0) 178. In the preferred embodiment, a general purpose DSP 176 is used to implement the ALC algorithm. Alternatively, a specially-designed logic circuit, or block, not shown, could be used to generate the control code D3(Z:0) 178 via an ALC algorithm. The ALC algorithm may generate the control code D3(Z:0) 178 using, for example, a digital computation or a look-up table. The ALC algorithm is preferably able to appropriately adjust the control code D3(Z:0) 178 in response to small changes in the digital signal D1(X:0) 174 while not generating audible effects in the forward path signal D2(Y:0) 177 as the adjustments to the control code 178 are fed back to the PGA 110.

As an important, but optional, feature of the present invention, a mapping block 186 may be included in the feedback control path. The mapping block 186, if used, is coupled between the DSP 176 and the delta-sigma modulator 180. The mapping block 186 is capable to map the control code 178 D3(Z:0) to a network-specific code D4(Q:0) 188. Typically, linear (dB) relationships between the control code 178 and the gain of the PGA 110 are desired. In the prior art, this relationship limits the useful configurations of the switchable resistor network 120. As a result, some more desirable and effective switchable resistor networks can't be used. However, the mapping block 186 facilitates further manipulation of the control code 178, beyond the ALC algorithm, to tailor the control feedback signal to the behavior of any switchable resistor network configuration. For example, the ALC algorithm may be implemented to generate a generic set of control codes D3(Z:0) 178 in response to a set of digital signals D1(X:0) 174. The mapping block 186 allows this generic set of control codes D3(Z:0) 178, which may implement a linear control code-to-gain algorithm, to be further optimized, via a mapping function, to a set of network-specific codes D4(Q:0) 188, which may account for non-linear behavior in the chosen switchable resistor network 120. This mapping function allows the control architecture of the present invention to work optimally over a range of switchable resistor networks 120. Therefore, in the present invention, the switchable resistor network 120 may be implemented in any of a large variety of configurations, including R-2R ladders, binary-weighted resistors, and other configurations as will be apparent to those skilled in the art.

The mapping block 186 may be a stand-alone digital block, as shown. Alternatively, the mapping block 186 may be implemented on a general purpose DSP or integrated onto the DSP 176 responsible for the ALC algorithm. In various configurations, the mapping block 186 may apply an inverse function to the control code 178, may map according to a linear function or a non-linear function. Other configurations will be apparent to those skilled in the art. As a further feature, the mapping block 186 may be used to implement a companding function.

As one example, the ADC 170 converts the analog output 164 into a 4-bit coded digital signal D1(X:0) 174 at a frequency of 64 $f_s$. In the embodiment illustrated in FIG. 3, the digital signal 224 is further digitally filtered and converted to a 24-bit coded signal 234, at a frequency of $f_s$ via a decimation filter. Referring again to FIG. 1, the DSP 176, in implementing the ALC algorithm, generates a control code D3(Z:0) 178. For example, the control code D3 (Z:0) is a 24-bit coded signal running at a frequency of $f_s$. The mapping block 186 maps the control code 178 to a network-specific code D4(Q:0) 188 as a 24-bit coded signal running at a frequency of $f_s$. As can be seen, these configurations allow the DSP 176 and the mapping block 186 to operate at a slow frequency, $f_s$.

As an important feature of the present invention, a delta-sigma modulator 180 is coupled between the DSP 176 and the PGA 110. The delta-sigma modulator 180 receives either the control code D3(Z:0) 178, or the network-specific code D4(Q:0) 188 if the mapping block 186 is used. The delta-sigma modulator then generates a PDM signal 182 on the control code 178 or network-specific code 188. For example, a 1-bit PDM coded signal 182 is generated at a frequency of 256 $f_s$. In this example, there are two PDM signals, 182 and 184, that are of opposite phase. Each PDM signal 182 and 184 controls one of the switches SW1 144 and SW 146 in the switchable resistor network 120 of the PGA 110. Alternatively, a larger number of PDM signals may be generated by the delta-sigma modulator 180 to facilitate control of a larger number of switches in the switchable resistor network 120. Alternatively, the delta-sigma modulator 180 may generate multiple bit PDM signals. For example, a 1-bit encoded PDM signal may alternate between two different duty cycles corresponding to two different states, as is described below. Similarly, a 2-bit encoded PDM signal may alternate between four different duty cycles corresponding to four different states. A 3-bit encoded PDM signal may encode up to 8 duty cycle states. Each level, or duty cycle state, can be used to drive a complementary pair of switches in the switchable resistor network.

Figure 2:
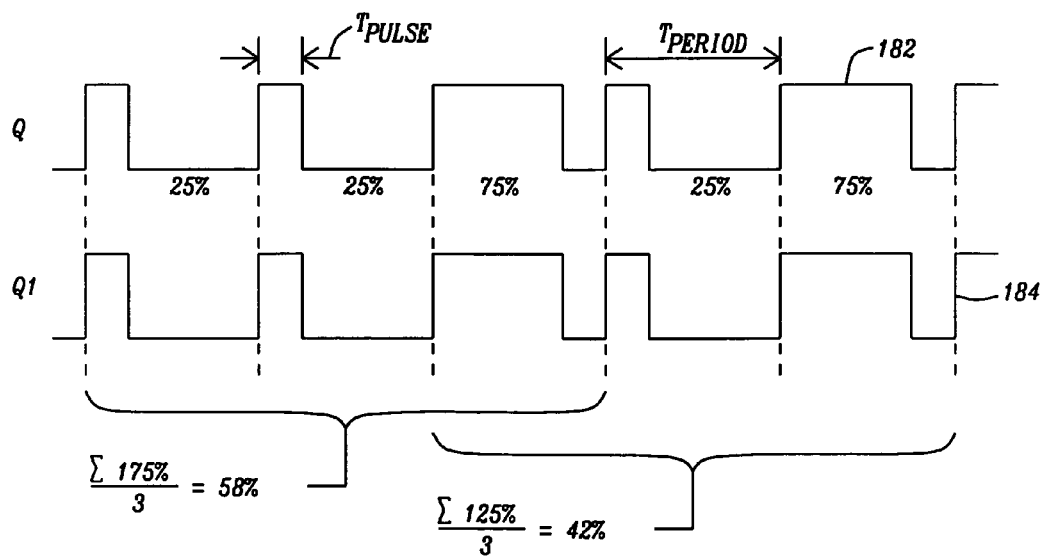
FIG. 2 is a signal diagram illustrating one example of a pulse-density modulated signal generated by a delta-sigma modulator in accordance with one embodiment of the invention.

Referring now to FIG. 2, a signal diagram illustrates one example of PDM signals 182 and 184 generated by the delta-sigma modulator 180 in accordance with one embodiment of the invention. A single bit PDM signal 182 and an inverted signal version 184 are shown. Two available bit states ("0" and "1") are represented by two different duty cycles (25% and 75%). For each PDM period $T_{PERIOD}$, corresponding to bit rate of 256 $f_s$ in the example described above, the delta-sigma modulator generates a single pulse of width $T_{PULSE}$. The delta-sigma modulator uses a comparative function ("delta") combined with a summing function ("sigma") to generate a continuous series bit states that represent a "digital average" of the control code D3(Z:0) 178 (or D4(Q:0) if the mapping block is used). The control code 178 is a preferably a stream of codes received at the delta-sigma modulator. For example, the control code 178 may be a stream of 24-bit codes arriving at a frequency of $f_s$. This code stream is converted by the delta-sigma modulator 180 to a stream of pulse-density modulated (PDM) pulses 182. In one example, the PDM signal 182 is a 1-bit signal operating at a frequency of 256 $f_s$. Alternatively, the PDM signal 182 may be encoded as a multiple bit signal. Over time, the PDM signal encodes a moving average of duty cycle percentages is generated as can be seen. In the illustration, for the first three periods, an average of 58% duty cycle is generated. Over the last three periods, the average is 42%. The PDM signals 182 and 184 control the amount of time the PGA 110 is configured in each of the possible resistor ratios, and, by extension, each of the possible transfer gains. In this way, the average gain of the PGA 110 is controlled over time. Importantly, the delta-sigma modulator 180 is configured to provide the PGA 110 with a negative feedback of the control code D3(Z:0) 178—with the negatively fed signal being a delta-sigma modulated PDM signal 182 and inverted complimentary signal 184. Alternatively, the switchable resistor network 120 may be configured such that only one switch is cycled on and off by the delta-sigma modulated PDM signal 182. In such a configuration, the single switch could be configured to add or remove a resistance in parallel. The particular PDM signal-to-switch configure would depend upon the topology of the switchable resistor network.

The pulse-width $T_{PULSE}$ of the PDM signal 182 is dithered between the high and low duty cycles such that the time-average output is that of the desired high-resolution, pulse-width. In this example, 25% and 75% duty cycles are used for the low and high states. Other duty cycle states could be chosen. In addition, a multiple bit PDM may be generated. For example, a 2-bit PDM could be generated with four total states. In that case, the PDM signal would be capable of modulating up to 2 pairs of switches (4 total switches) in the switchable resistor network 120 of the PGA 110. If, for example, the operating condition of the PGA 110 required a 50% duty cycle encoded as the 1-bit PDM, then the PDM signal 182 from the delta-sigma modulator 180 would be expected to send, on average, an equal number of low (25%) duty cycle periods and high (75%) duty cycle periods. By varying the average low and high duty cycle content of the 1-bit PDM stream, the delta-sigma modulator 180 is able to adjust the transfer gain through the PGA 110. And, because the delta-sigma modulator 180 is able to send the pulses at a high rate of, for example, 256 $f_s$, a highly effective pulse-width resolution is achieved. This gain resolution is limited by the rate of change of the pulse-width relative to the rate of change of the gain or over-sampling ratio and by the order of the signal-delta modulator used (i.e., the noise shaping).

Delta-sigma modulation employs both oversampling and noise-shaping to increase the resolution of the output pulse-width ratio. Even where the PDM is a 1-bit stream, the maximum timing requirements for the integrated circuit are not exceeded. In addition, analog-to-digital conversion induced quantization noise may be shaped at the delta-sigma modulator 180, with feedback, such that the noise is reduced in the band of interest and increased for out-of-band signals. Lowering of the in-band quantization noise leads to an increase in pulse-width resolution which, in turn, increases the gain resolution for the PGA 110. In addition, some of the high-frequency quantization noise will be shaped by the finite gain bandwidth of the PGA 110.

Figures 3, 4:
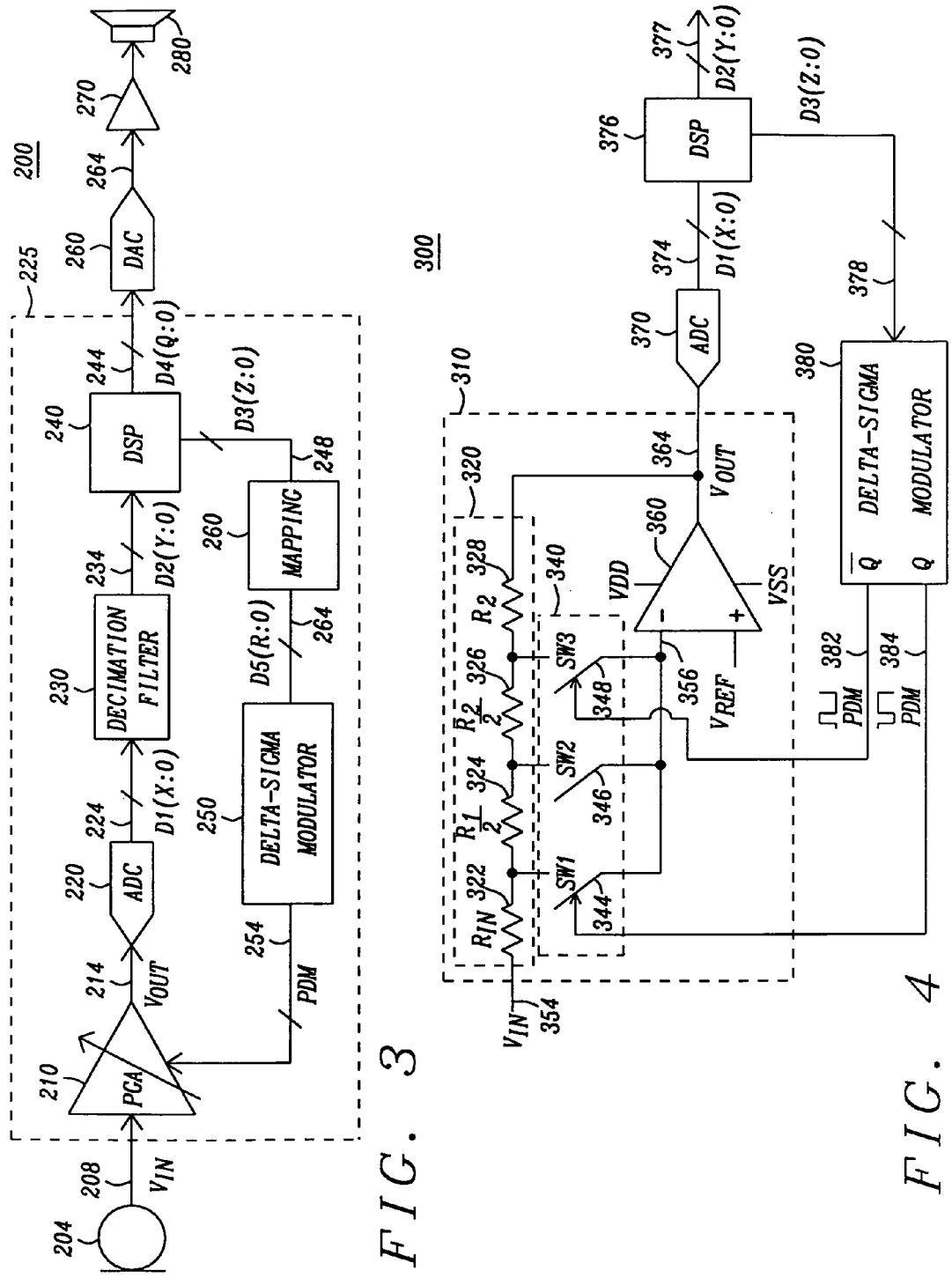
FIG. 3 a circuit schematic diagram illustrating one example of a variable gain circuit device using a variable gain amplifier device in accordance with one embodiment of the invention.
FIG. 4 a circuit schematic diagram illustrating one example of a variable gain amplifier device showing non-adjacent switching in accordance with one embodiment of the invention.

Referring now to FIG. 3, a circuit schematic diagram illustrates one example of a variable gain circuit device 200 using a variable gain amplifier device 225 in accordance with one embodiment of the invention. The circuit 200 could be a mobile device, such as a cellular phone. The system 200 includes a microphone 204, a variable gain input circuit 225, a digital-to-analog converter (DAC) 260, an output driver 270, and a speaker 280. The circuit 200 is configured to capture sound via the microphone 204, which generates an analog input signal $V_{IN}$ 208. The input signal 208 is amplified using a programmable gain amplifier (PGA) 210 to generate analog output signal $V_{OUT}$ 214. The analog output signal $V_{OUT}$ 214 is then converted to a first digital signal D1(X:0) 224 by an analog-to-digital converter (ADC) 220. The digital signal D1(X:0) 224 is then processed though a decimation filter 234 to generate a second digital signal D2(Y:0) 234. The second digital signal D2(Y:0) 234 is received by a digital signal processor (DSP) 240. The DSP 240 processes the second digital signal 234 through an automatic level control (ALC) algorithm that generates a control code D3(Z:0) 248. In addition, the DSP 240 may digitally process the second digital signal 234 to produce a third digital signal D4(Q:0). The third digital signal D4(Q:0) 244 is received by a digital-to-analog converter (DAC) 260, which converts the third digital signal 244 to a second analog output signal 264. This second analog output signal 264 is input to a power amplifier 270 that drives an output speaker 280. The control code D3(Z:0) 248 may be received directly at the delta-sigma modulator 250. Alternatively, the mapping block 260 may be used to first map the control code D3(Z:0) 248 to a network-specific code D5(R:0) 264 before presentation to the delta-sigma modulator 250. The delta-sigma modulator 250 generates a pulse-density modulated (PDM) signal 254 based on the control code 248, or network-specific code 264. The PDM signal 254 is fed back to the PGA 210 to control switches, not shown, in a switchable resistor network within the PGA 210. In one example, the ADC 220 converts the analog signal $V_{OUT}$ 208 to a 4-bit digital stream D1(X:0) at frequency 64 $f_s$. The decimation filter 230 reduces the frequency to $f_s$ while increasing the word size to 24 bits so that the DSP can process the data stream D2(Y:0) 234 at $f_s$. The DSP 240 produces the control code D3(Z:0) 248 as a 24-bit code at frequency to $f_s$. The mapping block, maintains the same bit size and frequency. The delta-sigma modulator 250 converts this low frequency, high bit count data to a 1-bit PDM signal 254 running at the high frequency of 256 $f_s$.

In one example, a third order, delta-sigma modulator 250 accepts the 24-bit data D3(Z:0) at $f_s$ and modulates this data to a 1-bit, 256 $f_s$, oversampled output pulse-density modulated (PDM) signal. In this example, $f_s$ (the Nyquist Frequency) is set at 48 kHz so that the maximum clock frequency for the 256 over-sampling ratio is 12.2288 MHz. To achieve an effective, 16-bit resolution for the over-sampled, 1-bit PDM signal 254, a third-order delta-sigma modulator 250 may be used.

In practice, very low or very high duty-ratios are difficult to achieve with 1-bit PDM modulation switching of the switching network as configured in the programmable gain amplifier used in the embodiment of FIG. 1. This effect may limit the resolution at the extremes of the gain range. To improve performance in this regime and to achieve finer gain resolution over the entire gain range, the switching of non-adjacent switch pairs may be implemented. Referring now to FIG. 4, a circuit schematic diagram illustrates one example of a programmable gain amplifier circuit 300 showing non-adjacent switching in accordance with one embodiment of the invention. The circuit 300 includes a programmable gain amplifier 310, an analog-to-digital converter 370, and a delta-sigma modulator 380. The programmable gain amplifier 310 includes an amplifier 360 having an input 356 and an output 364; a resistor network 320 including a plurality of resistors 322, 324, 326, and 328; and a switching network 340. The switching network 340 includes a plurality of switches SW1 344, SW2 346, and SW3 348 arranged between the amplifier 360 and the resistor network 320. The analog-to-digital converter 370 is used to convert the amplifier output 364 from an analog signal to a digital signal D1(X:0) 374. The DSP 376 receives the digital signal D1(X:0) 374, performs an ALC algorithm on the signal, and generates a control code D3(Z:0) 378. Further, the DSP 376 digitally processes the digital signal D1(X:0) 374 to produce the second digital signal D2(Y:0) 377. This embodiment does not illustrate a decimation filter, as shown in FIG. 3, however such a filter may be used. Further, no mapping block is shown. However, a mapping block may be used.

The delta-sigma modulator 380 receives the control code D3(Z:0) 378. The delta-sigma modulator 380 generates a pulse-density modulated (PDM) signal 382, and an inverted version of the same 384, based on the control code D3(Z:0) 378. The PDM signals 382 and 384 are fed back to the switchable resistor network 320 of the PGA 310 to control the switches 344, 346, and 348 in the network 320. This PDM signals 382 and 384 facilitate selective coupling of varied resistances between a signal input $V_{IN}$ 354 and the amplifier input 356 and between the amplifier input 356 and the amplifier output 364. Of particular importance to this embodiment, the PDM signals 382 and 384 are applied to non-adjacent switches SW1 344 and SW3 348 with intervening switch SW2 346 left open. In this configuration, a control signal duty ratio lying approximately mid-way can be readily implemented.

The delta-sigma modulator 380 used in the present invention need not be limited to 1-bit PDM output. A multiple-bit output may be used to allow control of a switching network 340 including more than 2 switches. A multiple-bit PDM signal reduces slew-rate requirements of the PGA 310 and prevents output clipping. In addition, a multiple-bit PDM signal helps alleviate the duty-ratio range restrictions found with the 1-bit PDM.

The resistor network 320 may be extended such that it includes an input resistor $R_{IN}$ and greater than three additional series resistors. Alternatively, less than three resistors may be used. This extend configuration allows for PGA minimum gain and maximum gain values that accommodate the resulting modulated duty-ratios. In addition, a 1-bit PDM output may be used to switch all the resistors so that silicon area requirements are minimized. The present invention details a device and method for improving gain resolution. The present invention differs from approaches directed at gain trim.

Although, the resistor 'sliding' ladder has been used to illustrate the resistor networks in the illustrations, the actual resistor network implementation is flexible. Delta-sigma modulator pulse-density modulation feedback may be applied to any switched-resistor configuration, including binary-weighted resistors, R-2R resistor ladders, and other configurations as apparent to one skilled in the art. This flexibility is due to the ability of the present invention to apply any known gain transfer function to a resistor network regardless of the specific control architecture response. Due to the transfer function being known, a mapping of code to gain can be used to compensate, if necessary. In addition, the amplifier in the illustrated embodiments is used in an inverting-phase configuration. However, the delta-sigma modulator pulse-density modulation feedback scheme of the present invention may be applied to non-inverting phase configurations or to differential amplifiers.

The increased gain-resolution of the present invention facilitates alteration of the variable gain amplifier device without any audible distortion and without the use of a zero-cross detector. Elimination of a zero-cross detector saves power consumption, silicon area and reduces system complexity. In addition, the Gain alterations are carried out at the oversampling rate so that the system can react in a frequency dependent nature to the input signal. This fast reaction time allows a desired filter transfer function to be implemented by altering the gain when a particular frequency is detected. For example, a digital filter may be added to the delta-sigma modulator to detect a frequency in the digital signal that forms its input. The delta-sigma modulator then alters its performance in response to the detection of the frequency. This concept is of particular importance to mobile phone application where GSM noise at 217 Hz causes audible effects. The present invention can also provide a notch filter to eliminate noise at this frequency appearing on the output.

Another potential application for frequency-dependent gain alterations is to compensate for microphone 'droop' or balancing. Droop herein refers to the gradual roll-off of the amplitude-response of a microphone with increasing frequency. By applying the inverse frequency response characteristic of a microphone, the amplitude response may be flattened, thereby improving the perceived audio response characteristic of the microphone. In this case, the delay in the response loop (DSP to mapping to sigma-delta modulator to PGA) would need to be accounted for using, for example predictive filters. An alternative approach to achieving a filter response in the PGA is to apply noise shaped to a desired frequency response at the input to the sigma-delta modulator or at the input of the mapping block, if used. The level of noise at a particular frequency would define the amplitude response of the amplifier at that particular frequency. This shaped noise effectively attributes a frequency dependence to the switchable resistor network by selectively introducing a sine wave at the input to the sigma-delta modulator at a frequency matched to the desired filter response and qualified by the frequency response of the network.

In addition to filtering to improve the audio quality of the output, companding may also be used to extend the apparent dynamic range of the input signal. Companding exploits the redundancy of the human-ear in discriminating between loud and soft sounds to achieve a higher average dynamic range. Companding using the PGA can be implemented before quantization to maximize its usefulness. Companding creates a non-linear static voltage dependency in the input resistance of the PGA (through the switchable resistor network). It may again be necessary in some companding implementations to use a predictive filter to account for the response loop.

Figure 5:
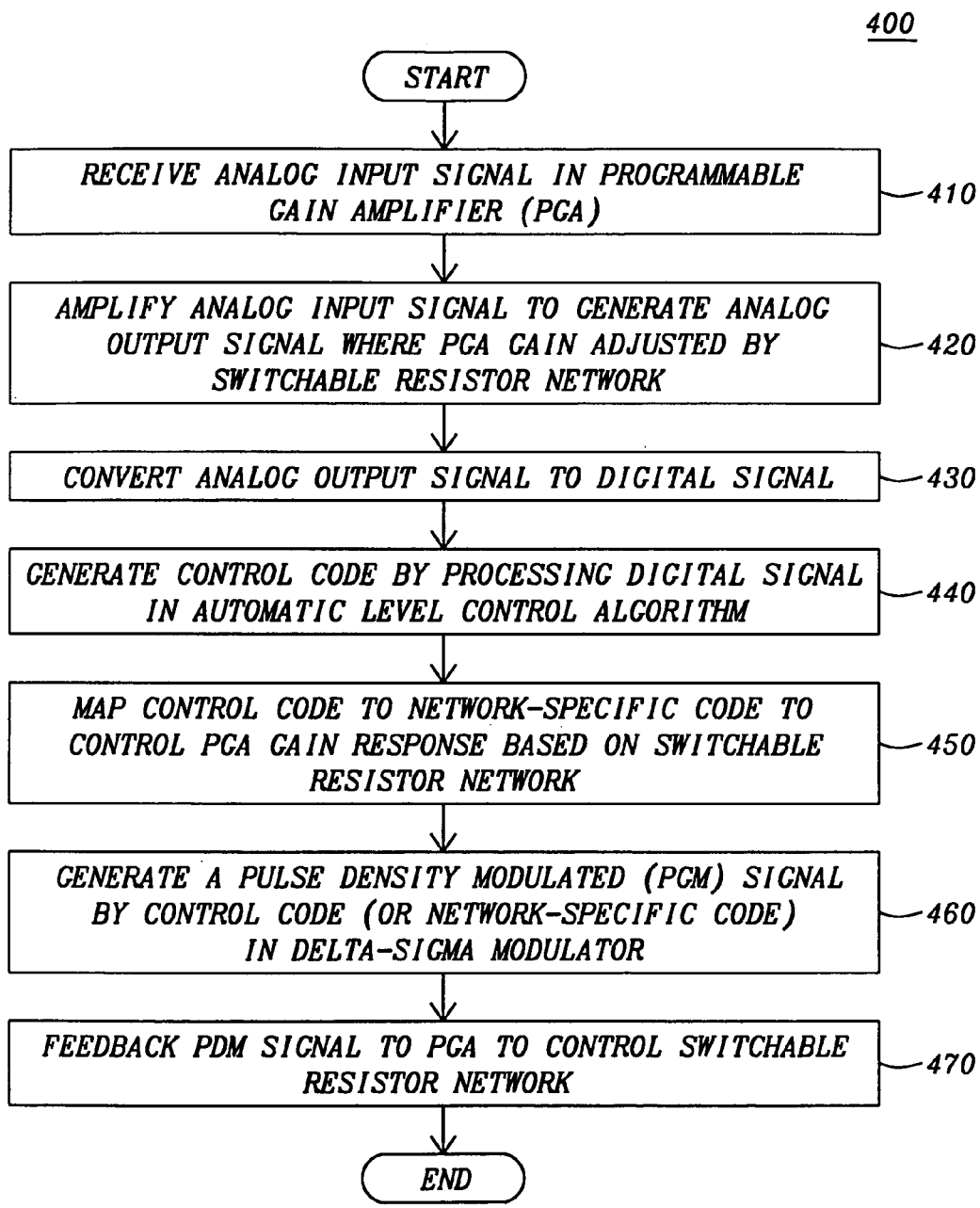
FIG. 5 is a flowchart illustrating one example of a method to improve gain resolution in a variable gain amplifier device in accordance with one embodiment of the invention.

FIG. 5 is a flowchart illustrating one example of a method 400 to improve gain resolution in a programmable gain amplifier device in accordance with one embodiment of the invention. The flowchart method 400 shows operating steps performed to improve gain resolution in general. In particular, one example of a method 400 performed by a variable gain amplifier 100 of FIG. 1 is shown. Referring again to FIG. 5, the method begins in step 410 where an analog input signal 154 is received at a programmable gain amplifier 110. In step 420, the analog input signal 154 is amplified to thereby generate an analog output signal 164. A gain of the programmable gain amplifier 110 is adjusted by controlling a switchable resistor network 120. In step 430, the analog output signal 164 is converted to a digital signal 174. In step 440, a control code 178 is generated by processing the digital signal 174 in an automatic level control (ALC) algorithm. In step 450, the control code 178 is mapped to a network-specific code 188 via the mapping block 186. The network-specific code 188 is then used to control the gain response of the programmable gain amplifier 110 by manipulating the switchable resistor network 120. In step 460, a pulse-density modulated signal 182 and 184 is generated by processing the control code 178 in a delta-sigma modulator 180. Finally, in step 470, the pulse-density modulated signal 182 and 184 is fed back to the programmable gain amplifier 110 to control the switchable resistor network 120.

As such, a novel variable gain amplifier device with improved gain resolution and a method to improve gain resolution in a variable gain amplifier device are herein described. The circuit provides variable gain amplification with improved gain resolution. The improved gain resolution is achieved with minimal impact on silicon area or power usage. The improved gain resolution is achieved within normal clock frequency limitations. The device and method are applicable to a variety of programmable gain amplifiers and resistor network schemes. The device and method are extensible to add frequency dependent filtering functions or input dependent gain functions, such as companding. Other advantages will be recognized by those of ordinary skill in the art.

The above detailed description of the invention, and the examples described therein, has been presented for the purposes of illustration and description. While the principles of the invention have been described above in connection with a specific device, it is to be clearly understood that this description is made only by way of example and not as a limitation on the scope of the invention.

What is claimed is:

1. A variable gain amplifier device with improved gain resolution, the device comprising:
   a programmable gain amplifier operable to receive an analog input signal and to amplify the analog input signal to thereby generate an analog output signal, the programmable gain amplifier comprising:
      an amplifier; and
      a switchable resistor network;
   an analog-to-digital converter communicatively coupled to the programmable gain amplifier and operable to convert the analog output signal to a digital signal;
   an automatic level control algorithm means communicatively coupled to the analog-to-digital converter and operable to generate a control code by processing the digital signal; and
   a delta-sigma modulator communicatively coupled to the automatic level control algorithm means and operable to generate a pulse-density modulated signal by processing the control code wherein the pulse-density modulated signal is fed back to the programmable gain amplifier to control the switchable resistor network.

2. The device of claim 1 wherein a switchable resistor network comprises:
   a plurality of resistors; and
   a plurality of switches communicatively coupled to the resistors and to the amplifier and operable to alter the configuration of the plurality of resistors to thereby alter the gain of the programmable gain amplifier.

3. The device of claim 1 further comprising a mapping means communicatively coupled to the control code and operable to map the control code to a network-specific code to control the programmable gain amplifier gain response based on the switchable resistor network.

4. The device of claim 3 wherein the mapping means comprises a digital signal processor.

5. The device of claim 3 wherein the mapping means implements a companding function.

6. The device of claim 1 wherein the pulse-density modulated signal controls non-adjacent switches in the switching network.

7. The device of claim 1 wherein the switchable resistor network comprises a plurality of binary-weighted resistors.

8. The device of claim 1 wherein the switchable resistor network comprises resistor ladders further comprising R and 2R resistors.

9. The device of claim 1 further comprising a decimation filter communicatively coupled to the analog-to-digital converter and operable to generated a digital code by filtering the digital signal and wherein the automatic level control algorithm means processes the digital signal indirectly by processing the digital code.

10. The device of claim 1 wherein the automatic level control algorithm means is further operable to detect a frequency in the digital signal and to generate the digital code by performing frequency specific processing of the digital signal or by applying a particularly shaped noise signal at an input to the delta-sigma modulator.

11. The device of claim 10 further comprising a mapping means communicatively coupled to the control code and operable to map the control code to a network-specific code to control the programmable gain amplifier gain response based on the switchable resistor network and wherein the automatic level control algorithm means is further operable to detect a frequency in the digital signal and to generate the digital code by applying a particularly shaped noise signal at an input to the mapping means.

12. A variable gain circuit device comprising
   a variable gain amplifier device with improved gain resolution, the device comprising:
      a programmable gain amplifier operable to receive an analog input signal and to amplify the analog input signal to thereby generate an analog output signal, the programmable gain amplifier comprising:
         an amplifier; and
         a switchable resistor network;
      an analog-to-digital converter communicatively coupled to the programmable gain amplifier and operable to convert the analog output signal to a digital signal;
      an automatic level control algorithm means communicatively coupled to the analog-to-digital converter and operable to generate a control code by processing the digital signal; and a delta-sigma modulator communicatively coupled to the automatic level control algorithm means and operable to generate a pulse-density modulated signal by processing the control code wherein the pulse-density modulated signal is fed back to the plurality of switches to control the switchable resistor network;

a digital signal processor communicatively coupled to the analog-to-digital converter and operable to process the digital signal into a second digital code; and a digital-to-analog converter communicatively coupled to the digital signal processor and operable to covert the second digital code to a second analog output signal.

13. The device of claim 12 wherein a switchable resistor network comprises:
a plurality of resistors; and
a plurality of switches communicatively coupled to the resistors and to the amplifier and operable to alter the configuration of the plurality of resistors to thereby alter the gain of the programmable gain amplifier.

14. The device of claim 12 wherein the automatic level control algorithm means comprises a digital signal processor.

15. The device of claim 12 further comprising a mapping means communicatively coupled to the control code and operable to map the control code to a network-specific code to control the programmable gain amplifier gain response based on the switchable resistor network.

16. The device of claim 12 wherein the pulse-density modulated signal controls non-adjacent switches in the switchable resistor network.

17. The device of claim 12 further comprising a decimation filter communicatively coupled to the analog-to-digital converter and operable to generated a digital code by filtering the digital signal and wherein the automatic level control algorithm means processes the digital signal indirectly by processing the digital code.

18. The device of claim 12 wherein the automatic level control algorithm means is further operable to detect a frequency in the digital signal and to generate the digital code by performing frequency specific processing of the digital signal.

19. A method to improve gain resolution in a variable gain amplifier device, the method comprising:
receiving an analog input signal at a programmable gain amplifier;
amplifying the analog input signal to thereby generate an analog output signal where a gain of the programmable gain amplifier is adjusted by controlling a switchable resistor network;
converting the analog output signal to a digital signal;
generating a control code by processing the digital signal in an automatic level control (ALC) algorithm;
generating a pulse-density modulated signal by processing the control code in a delta-sigma modulator; and
feeding back the pulse-density modulated signal to the programmable gain amplifier to control the switchable resistor network.

20. The method of claim 19 wherein the automatic level control algorithm means comprises a digital signal processor.

21. The method of claim 19 further comprising a step of mapping the control code to a network-specific code to control the programmable gain amplifier gain response based on the switchable resistor network.

22. The method of claim 21 wherein the step of mapping further comprises producing a companding function.

23. The method of claim 19 wherein the pulse-density modulated signal is a single bit signal.

24. The method of claim 19 wherein the pulse-density modulated signal is a multiple bit signal.

25. The method of claim 19 wherein the step of generating a pulse-density modulated signal further comprises detecting a frequency in the digital signal and altering performance of the delta-sigma modulator in response to the detection of the frequency.

* * * * *